United States Patent
Kwong et al.

(10) Patent No.: US 7,051,433 B1
(45) Date of Patent: *May 30, 2006

(54) MULTILAYER CIRCUIT BOARD

(75) Inventors: Herman Kwong, Kanata (CA); Larry E. Marcanti, Allen, TX (US); Aneta Wyrzykowska, Kanata (CA)

(73) Assignee: Nortel Networks Limited, St. Laurent ( * ) Notice: Subject to any disclaimer, the term of this patent is extended or adjusted under 35 U.S.C. 154(b) by 333 days.

This patent is subject to a terminal disclaimer.

(21) Appl. No.: 10/431,388

(22) Filed: May 8, 2003

Related U.S. Application Data (60) Division of application No. 09/739,976, filed on Dec. 20, 2000, now Pat. No. 6,577,508, which is a continuation-in-part of application No. 09/636,594, filed on Aug. 10, 2000, now Pat. No. 6,445,591.

(51) Int. Cl.
*H01K 3/10* (2006.01)
(52) U.S. Cl. .............................. 29/852; 29/825; 29/830; 361/764
(58) Field of Classification Search .................. 29/825, 29/830, 832, 852; 361/764
See application file for complete search history.

(56) References Cited

U.S. PATENT DOCUMENTS

| | | | |
|---|---|---|---|
| 5,206,986 A | 5/1993 | Arai et al. | |
| 5,557,502 A | 9/1996 | Banerjee et al. | |
| 5,598,031 A | 1/1997 | Groover et al. | |
| 5,598,034 A | 1/1997 | Wakefield | |
| 5,608,261 A | 3/1997 | Bhattacharyya et al. | |
| 5,869,883 A | 2/1999 | Mehringer et al. | |
| 5,895,967 A | 4/1999 | Stearns et al. | |
| 6,107,683 A | 8/2000 | Castro et al. | |
| 6,177,723 B1 | 1/2001 | Eng et al. | |
| 6,201,186 B1 | 3/2001 | Daniels et al. | |
| 6,329,713 B1 | 12/2001 | Farquhar et al. | |
| 6,440,770 B1 | 8/2002 | Banerjee et al. | |

*Primary Examiner*—Carl J. Arbes
(74) *Attorney, Agent, or Firm*—Hunton & Williams LLP (57) ABSTRACT

A technique for eliminating electrically conductive vias is disclosed. In one embodiment, the technique is realized as an improved multilayer circuit board for eliminating electrically conductive vias. The multilayer circuit board has a top layer and a buried layer separated by at least one dielectric layer, wherein the buried layer includes an electrically conductive power plane portion and an electrically conductive ground plane portion. The improvement comprises a cavity in the multilayer circuit board extending through the top layer and the at least one dielectric layer so as to expose at least a portion of the power plane portion and the ground plane portion of the buried layer within the cavity. The cavity is sized to accommodate an electronic component therein such that the electronic component makes electrical contact with the exposed portion of the power plane portion and the ground plane portion of the buried layer, thereby eliminating the need for electrically conductive vias electrically connected to the power plane portion and the ground plane portion of the buried layer.

12 Claims, 5 Drawing Sheets

MULTILAYER CIRCUIT BOARD

CROSS-REFERENCE TO RELATED APPLICATIONS

This patent application is a divisional application of U.S. patent application Ser. No. 09/739,976, filed Dec. 20, 2000, now U.S. Pat. No. 6,577,508 which is a continuation-in-part application of U.S. patent application Ser. No. 09/636,594, filed Aug. 10, 2000, now U.S. Pat No. 6,445,591 both of which are hereby incorporated by reference herein in their entirety.

FIELD OF THE INVENTION

The present invention relates generally to multilayer circuit boards and, more particularly, to an improved multilayer circuit board for improving power and ground filtering performance by eliminating the need for electrically conductive vias.

BACKGROUND OF THE INVENTION

Figure 1:
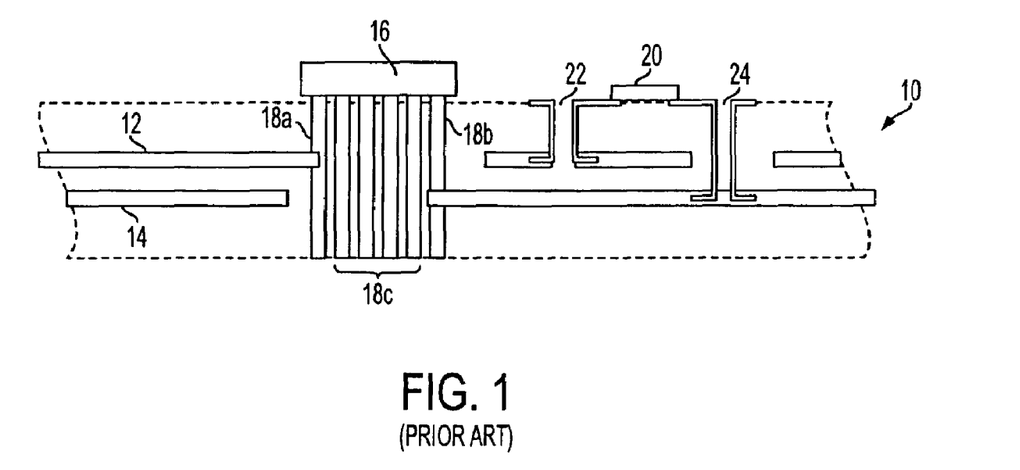
FIG. 1 shows a conventional power filtering design wherein a bypass capacitor is electrically connected between a power plane via and a ground plane via.

Referring to FIG. 1, there is shown a conventional power filtering design wherein a multilayer circuit board 10 has a power plane 12 and a ground plane 14 for providing power and around to an integrated circuit component 16 mounted on the multilayer circuit board 10. That is, the integrated circuit component 16 has a plurality of leads 18, including a power lead 18a, a around lead 18b, and a plurality of signals leads 18c. The integrated circuit component 16 is mounted on the multilayer circuit board 10 such, that the power lead 18a is electrically connected to the power plane 12, the ground lead 18b is electrically connected to the ground plane 14, and the signal leads 18c are electrically connected to signal conductors (not shown) formed on other layers of the multilayer circuit board 10. Thus, the power plane 12 provides power to the integrated circuit component 16, while the ground plane 14 provides a ground for the integrated circuit component 16.

When the integrated circuit component 16 is operating at high frequencies, high frequency noise often results on the power and ground planes 12 and 14 due to high speed internal switching within the integrated circuit component 16, resulting unsteady current requirements. To alleviate this high frequency noise problem, bypass capacitors are often electrically connected between power planes and ground planes on multilayer circuit boards. For example, in FIG. 1, a bypass capacitor 20 is shown electrically connected between an electrically conductive via 22 that is electrically connected to the power plane 12 and an electrically conductive via 24 that is electrically connected to the ground plane 14.

The purpose of the bypass capacitor 20 is to short together, at high frequencies, the power plane 12 and the ground plane 14, thereby filtering out any high frequency noise. However, because of parasitic inductance, capacitance, and resistance associated with the vies 22 and 24, the shorting capability, and thus the filtering capability, of the bypass capacitor 20 at high frequencies is diminished. Also, via inductance is more prevalent at high frequencies because the primary effect of series via inductance is that it degrades the effectiveness of power supply bypass capacitors, which defeats the whole power filtering strategy described above.

Attempts to solve the above-mentioned filtering problems have been pursued. For example, microvias have been used to shorten the length of vias, but they cannot eliminate vias completely. Also, via diameters have been reduced, thereby reducing the overall surface area over which parasitic inductance, capacitance, and resistance occur. However, changing the via diameter does little to influence via inductance. Thus, there remains a need for changing or eliminating the length of vias so as to improve power filtering performance.

In view of the foregoing, it would be desirable to provide a technique for improving power and ground filtering performance by changing or eliminating the length of electrically conductive vias which overcomes the above-described inadequacies and shortcomings.

SUMMARY OF THE INVENTION

According to the present invention, a technique for eliminating electrically conductive vias is provided. In one embodiment, the technique is realized as an improved multilayer circuit board for eliminating electrically conductive vias. The multilayer circuit board has a too layer and a buried layer separated by at least one dielectric aver, wherein the buried layer includes an electrically conductive power plane portion and an electrically conductive ground plane portion. The improvement comprises a cavity in the multilayer circuit board extending through the top layer and the at least one dielectric layer so as to expose at least a portion of the power plane portion and the ground plane portion of the buried layer within the cavity. The cavity is sized to accommodate an electronic component therein such that the electronic component makes electrical contact with the exposed portion of the power plane portion and the ground plane portion of the buried layer, thereby eliminating the need for electrically conductive vias electrically connected to the power plane portion and the ground plane portion of the buried layer.

In accordance with other aspects of the present invention, the buried layer beneficially includes a dielectric portion for separating the power plane portion and the ground plane portion.

In accordance with further aspects of the present invention, at least the lateral dimensions of the cavity are beneficially sized to directly coincide with at least the lateral dimensions of the electronic component. This is beneficially done whether the electronic component is an integrated circuit component or a discrete component, such as, for example, a capacitor for filtering noise from the power plane portion and the ground plane portion of the buried layer.

In accordance with still further aspects of the present invention, an electrically conductive shield is beneficially disposed on the top layer over the cavity or shielding electromagnetic interference to and from the electronic component.

In accordance with still further aspects of the present invention, wherein the electronic component is a first electronic component, a second electronic component is beneficially mounted on the top layer, wherein the second electronic component includes at least one electrically conductive lead extending into the cavity for electrical connection with the power plane portion or the ground plane portion the buried layer. Furthermore, wherein the cavity is a first cavity, wherein the at least one dielectric layer is at least one first dielectric layer, wherein an additional layer is disposed above and separated from the top layer by at least one second dielectric layer, the improvement further comprises a second cavity in the multilayer circuit board extending through the additional layer and the at least one second dielectric layer so as to expose at least a portion of the top layer, in this case, the second cavity is sized to accommodate the second electronic component therein. Typically, the second cavity is sized so as to be larger in lateral dimension than the first cavity. In any event, an electrically conductive shield may be beneficially disposed on the additional layer over the second cavity for shielding electromagnetic interference to and from the first and second electronic components.

In an first alternative embodiment, the technique is realized as a method for eliminating electrically conductive vies in a multilayer circuit board. The multilayer circuit board has a top layer and a buried layer separated by at least one dielectric layer, wherein the buried layer includes an electrically conductive power plane portion and an electrically conductive around plane portion. The method comprises forming a cavity in the multilayer circuit board extending through the top layer and the at least one dielectric layer so as to expose at least a portion of the power plane portion and the ground plane portion of the buried layer within the cavity. The cavity is sized to accommodate an electronic component therein such that the electronic component makes electrical contact with the exposed portion of the power plane portion and the ground plane portion of the buried layer, thereby eliminating the need for electrically conductive vias electrically connected to the power plane portion and the ground plane portion of the buried layer.

In accordance with other aspects of the present invention, the cavity may formed by etching the cavity in the multilayer circuit board. For example, the cavity may be etched by photolithographically etching the cavity in the multilayer circuit board, or plasma etching the cavity in the multilayer circuit board. Alternatively, the cavity may be formed by milling the cavity in the multilayer circuit board. For example, the cavity may be formed by laser ablating the cavity in the multilayer circuit board. Alternatively still, the cavity may be formed by prefabricating at least one of the top layer and the at least one dielectric layer such that the cavity is formed upon assembly of the top layer and the at least one dielectric layer in the multilayer circuit board.

In accordance with further aspects of the present invention, wherein the electronic component is a first electronic component, and wherein a second electronic component is mounted on the top layer, the method further beneficially comprises beneficially extending at least one electrically conductive lead of the second electronic component into the cavity for electrical connection with the power plane portion or the ground plane portion of the buried layer. Furthermore, wherein the cavity is a first cavity, wherein the at least one dielectric layer is at least one first dielectric layer, and wherein an additional layer is disposed above and separated from the top layer by at least one second dielectric layer, the method further beneficially comprises forming a second cavity in the multilayer circuit board extending through the additional layer and the at least one second dielectric layer so as to expose at least a portion of the top layer. The second cavity is beneficially sized to accommodate the second electronic component therein. Also, an electrically conductive shield may be beneficially disposed on the additional layer over the second cavity for shielding electromagnetic interference to and from the first and second electronic components.

In a second alternative embodiment, the technique is realized as an improved multilayer circuit board for eliminating electrically conductive vies. The multilayer circuit board has a top layer and a buried layer separated by at least one dielectric layer, wherein the buried layer includes an electrically conductive power/ground plane portion. The improvement comprises a cavity in the multilayer circuit board extending through the top layer and the at least one dielectric layer so as to expose at least a portion of the power/ground plane portion of the buried layer within the cavity. The cavity is sized to accommodate an electronic component therein such that the electronic component makes electrical contact with the exposed portion of the power/ground plane portion of the buried layer, thereby eliminating the need for electrically conductive vias electrically connected to the power/ground plane portion of the buried layer.

In a third alternative embodiment, the technique is realized as a method for eliminating electrically conductive vies in a multilayer circuit board. The multilayer circuit board has a top layer and a buried layer separated by at least one dielectric layer, wherein the buried layer includes an electrically conductive power/ground plane portion. The method comprises forming a cavity in the multilayer circuit board extending through the top layer and the at least one dielectric layer so as to expose at least a portion of the power/ground plane portion of the buried layer within the cavity. The cavity is sized to accommodate an electronic component therein such that the electronic component makes electrical contact with the exposed portion of the power/ground plane portion of the buried layer, thereby eliminating the need for electrically conductive vias electrically connected to the power/ground plane portion of the buried layer.

In a fourth alternative embodiment, the technique is realized as an improved multilayer circuit board for eliminating electrically conductive vies. The multilayer circuit board has a top layer separated from a group of adjacent buried layers by at least one first dielectric layer, wherein the group of buried layers includes an electrically conductive power plane layer, an electrically conductive ground plane layer, and at least one second dielectric layer separating the power plane layer from the ground plane layer so as to form a buried bypass capacitor within the multilayer circuit board. The top lever supports an electronic component thereon. The improvement comprises a cavity in the multilayer circuit board extending through the top layer and the at least one first dielectric layer so as to expose at least a portion of the power plane layer within the cavity. The cavity is sized to accommodate at least one extended electrically conductive lead of the electronic component for electrical connection with the power plane layer, thereby eliminating the need for electrically conductive vies electrically connected to the power plane layer.

In a fifth alternative embodiment, the technique is realized as a method for eliminating electrically conductive vies in a multilayer circuit board. The multilayer circuit board has a top layer separated from a group of adjacent buried layers by at least one first dielectric layer, wherein the grout of buried layers includes an electrically conductive power plane layer, an electrically conductive ground plane layer, and at least one second dielectric layer separating the power plane layer from the ground plane layer so as to form a buried bypass capacitor within the multilayer circuit board. The top layer supports an electronic component thereon. The method comprises forming a cavity in the multilayer circuit board extending through the top layer and the at least one first dielectric layer so as to expose at least a portion of the power plane layer within the cavity. The cavity is sized to accommodate at least one extended electrically conductive lead of the electronic component for electrical connection with the power plane layer, thereby eliminating the need for electrically conductive vias electrically connected to the power plane layer.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 2b is a top view of the single-sided multilayer circuit board shown in FIG. 2a.

DETAILED DESCRIPTION OF EXEMPLARY EMBODIMENT(S)

Figure 2A:
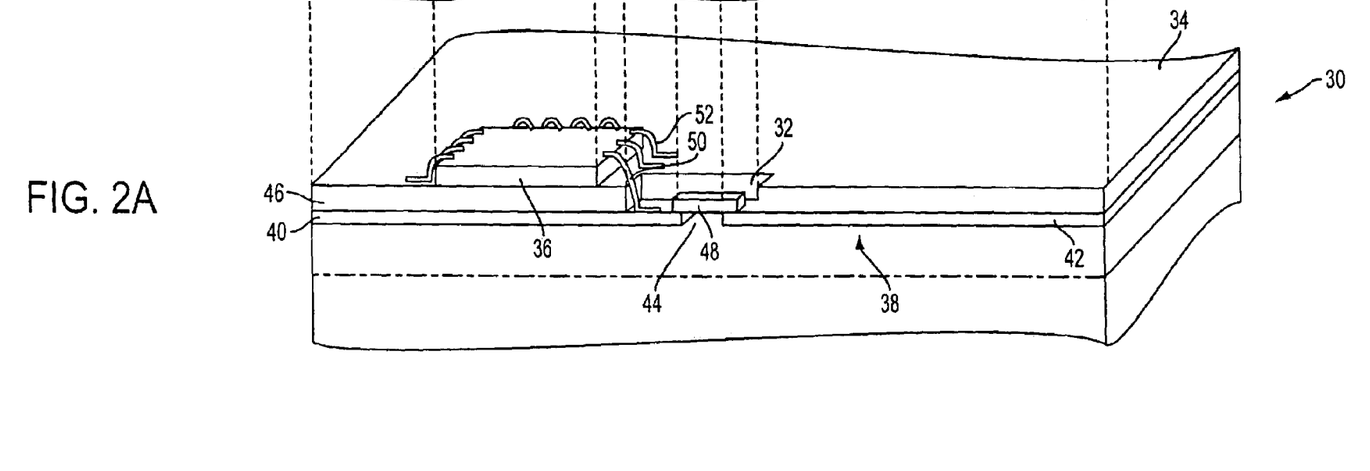
FIG. 2a is a side cross-sectional view of a single-sided multilayer circuit board having a cavity 32 formed therein in for eliminating power plane and ground plane vias in accordance with the present invention.
Figure 2B:
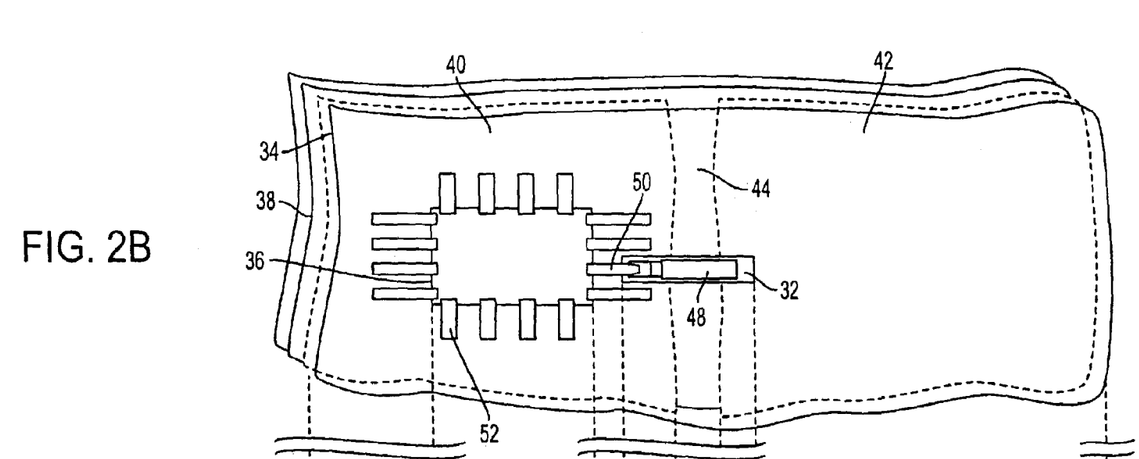

Referring to FIGS. 2a and 2b, there are shown a side cross-sectional view and a top view of a single-sided multilayer circuit board 30 having a cavity 32 formed therein in for eliminating power plane and ground plane vias in accordance with the present invention. The multilayer circuit board 30 comprises a top layer 34, upon which an electronic integrated circuit 36 having a gull wing leaded package is mounted, and a plurality of other layers including a split power/ground layer 38. That is, the power/ground layer 38 is such that a first portion of the split power/ground layer 38 is made up of a power plane 40 and a second portion of the split power/ground layer 38 is made up of a ground plane 42. In between the power plane 40 and the ground plane 42 is a dielectric region 44 for electrically separating the power plane 40 and the ground plane 42.

The split power/ground layer 38 is separated from the top layer 34 by at least one dielectric layer 46. That is, the split power/ground layer 38 is buried beneath the top layer 34 of the multilayer circuit board 30 and separated therefrom by at least one dielectric layer 46. Such an arrangement is typical in electronic circuit boards so that power and ground planes are not exposed for safety and other reasons. However, this arrangement has heretofore resulted in the need for power and ground plane vias for electrically connecting bypass capacitors, as described above.

The cavity 32 is formed in the multilayer circuit board 30 extending through the top layer 34 and the at least one dielectric layer 46 so as to expose at least a portion of the split power/ground layer 38. The portion of the split power/ground layer 38 that is exposed by the cavity 32 includes a portion of both the power plane 40 and the ground plane 42, as well as a portion of the dielectric region 44. The cavity 32 is sized so as to allow a discrete bypass capacitor 48 to be mounted therein such that the bypass capacitor 48 is electrically connected between the power plane 40 and the ground plane 42. That is, one end of the bypass capacitor 48 is electrically connected to the power plane 40 while the other end of the bypass capacitor 48 is electrically connected to the ground plane 42. Thus, the bypass capacitor 48 is directly electrically connected between the power plane 40 and the ground plane 42 such that no power plane vias or ground plane vias are required.

The cavity 32 is also sized so as to allow an extended gull wing lead 50 from the electronic integrated circuit 36 to be electrically connected to the power plane 40 in the direct vicinity of where the bypass capacitor 48 is electrically connected to the power plane 40. Thus, the electronic integrated circuit 36 is provided an exceptionally filtered power source.

At this point it should be noted that the extended gull wing lead 50 of the electronic integrated circuit 36 is easily obtained by not trimming off as much of the gull wing lead as would be the case for the other gull wing leads 52 of the electronic integrated circuit 36.

Figure 3:
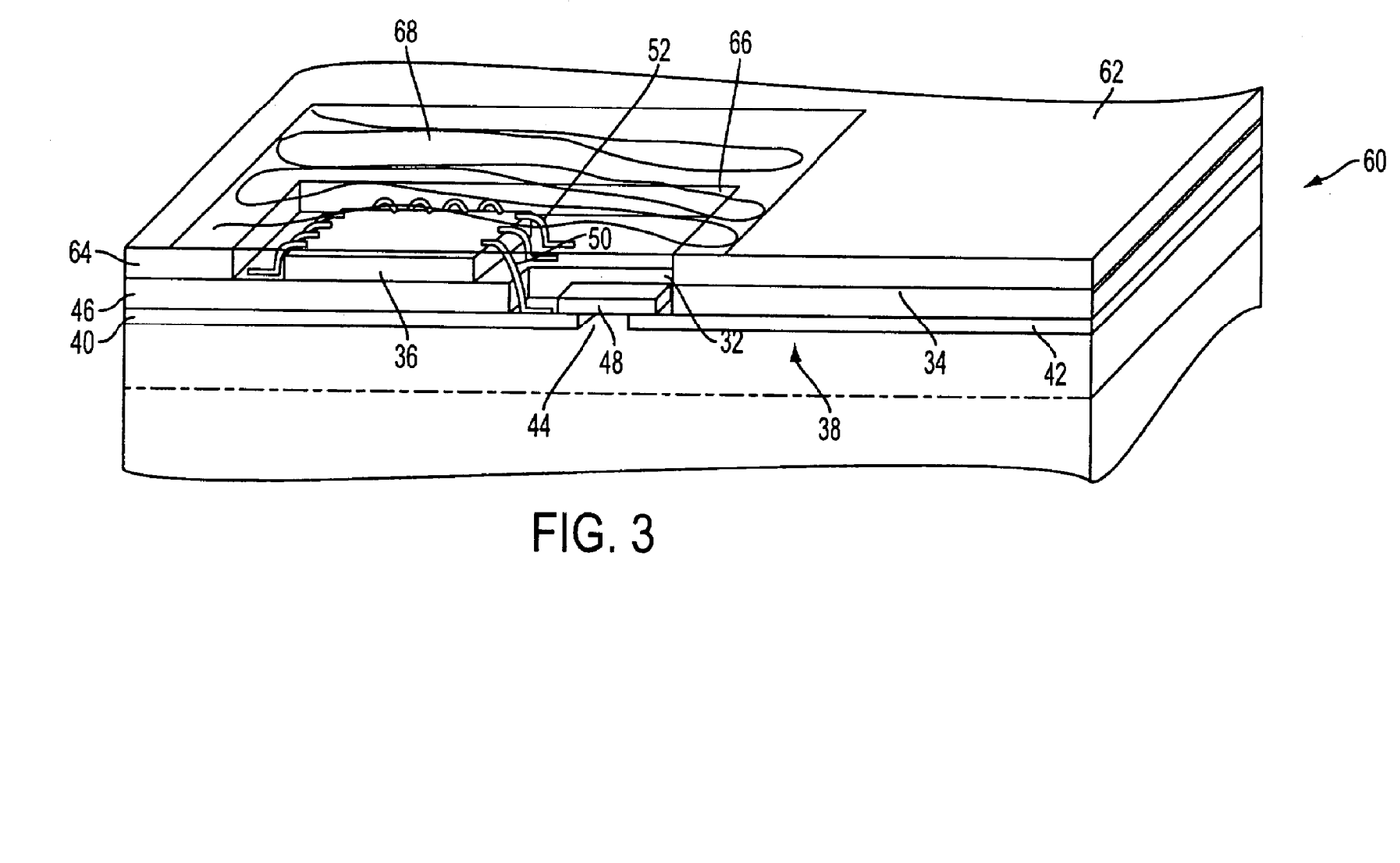
FIG. 3 shows a side cross-sectional view of an alternate embodiment of a single-sided multilayer circuit board in accordance with the present invention.

Referring to FIG. 3, there is shown a side cross-sectional view of an alternate embodiment of a single-sided multilayer circuit board 60 in accordance with the present invention. The multilayer circuit board 60 shares many of the same features of the multilayer circuit board 30 described above with reference to FIGS. 2a and 2b. Thus, those features will retain the same reference designators in FIG. 3.

The multilayer circuit board 60 differs from the multilayer circuit board 30 in the addition of a top ground layer 62 that is separated from previous top layer 34 with at least one additional dielectric layer 64. A cavity 66 is formed in the multilayer circuit board 30 extending through the top ground layer 62 and the at least one additional dielectric layer 64 so as to expose at least a portion of the previous top layer 34, as well as the portion of the split power/ground layer 38 that is exposed by the cavity 32. The portion of the previous top layer 34 that is exposed by the cavity 66 includes the area where the electronic integrated circuit 36 is mounted to the previous top layer 34.

An electrically conductive shielding plate 68 (shown in shadow form) is electrically connected to the top ground layer 62 so as to provide a shield for any electromagnetic interference (EMI) which may be emanating from the electronic integrated circuit 36 or against any EMI to which the electronic integrated circuit 36 may be susceptible.

Figure 4:
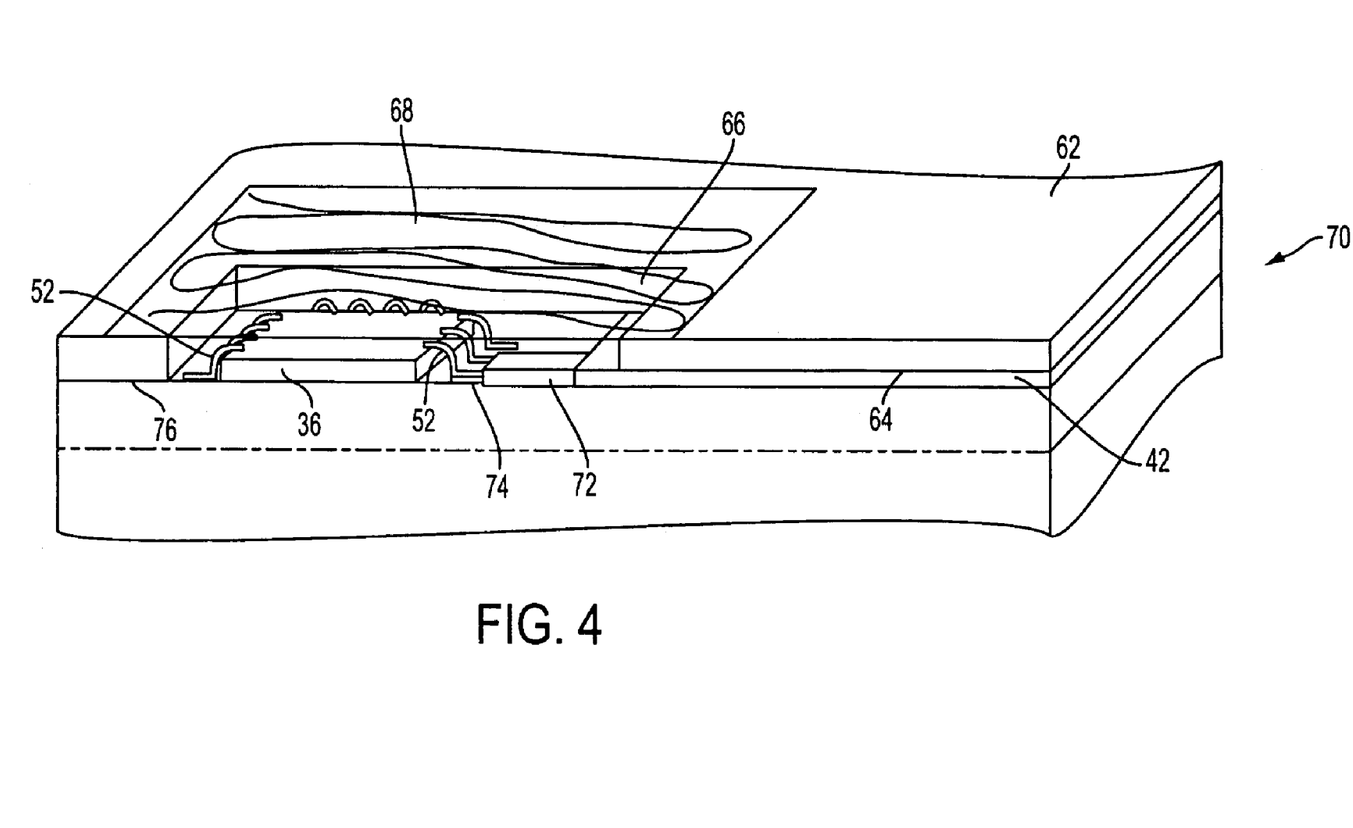
FIG. 4 shows a side cross-sectional view of another alternate embodiment of a single-sided multilayer circuit board in accordance with the present invention.

Referring to FIG. 4, there is shown a side cross-sectional view of another alternate embodiment of a single-sided multilayer circuit board 70 in accordance with the present invention. The multilayer circuit board 70 shares many of the same features of the multilayer circuit board 60 described above with reference to FIG. 3. Thus, those features will retain the same reference designators in FIG. 4.

The multilayer circuit board 70 differs from the multilayer circuit board 60 in the removal of the power plane 40, the removal of the previous top layer 34, the removal of the at least one dielectric layer 46, and hence the removal of the cavity 32 formed therein. Also, the multilayer circuit board 70 replaces the bypass capacitor 48 with a terminating resistor 72. The terminating resistor 72 is electrically connected between the ground plane 42 and an electrically conductive contact pad 74 formed on a signal layer 76 of the multilayer circuit board 70. That is, one end of the terminating resistor 72 is electrically connected to the ground plane 42 while the other end of the terminating resistor 72 is electrically connected to the electrically conductive contact pad 74 formed on the signal layer 76 of the multilayer circuit board 70. A gull wing lead 52 from the electronic integrated circuit 36 is also electrically connected to the electrically conductive contact pad 74 formed on the signal layer 76 of the multilayer circuit board 70. Thus, the terminating resistor 72 is essentially directly electrically connected between the ground plane 42 and the electronic integrated circuit 36 such that no ground plane vias are required. Thus, the electronic integrated circuit 36 is provided an exceptionally filtered ground termination.

Figure 5:
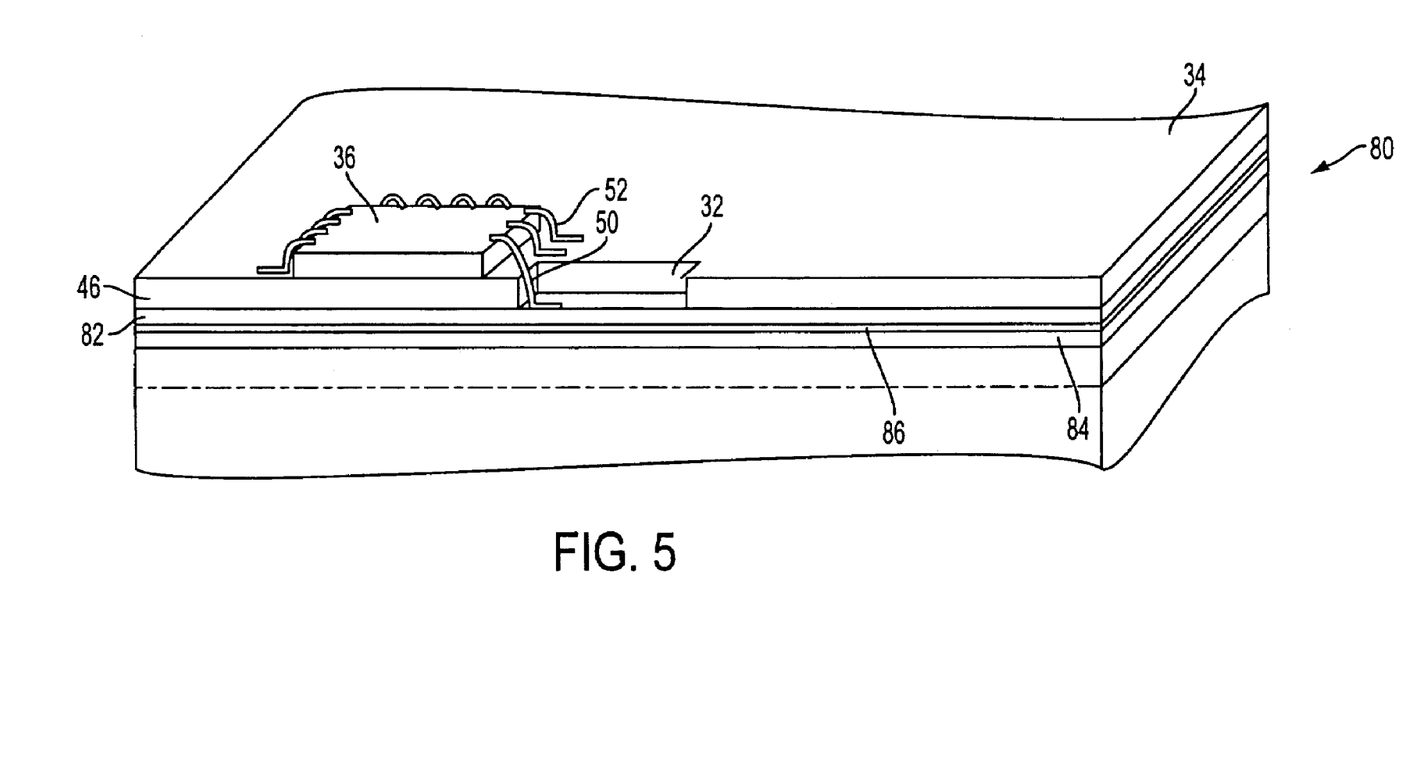
FIG. 5 shows a side cross-sectional view or further alternate embodiment of a single-sided multilayer circuit board in accordance with the present invention.

Referring to FIG. 5, there is shown a side cross-sectional view of further alternate embodiment of a single-sided multilayer circuit board 80 in accordance with the present invention. The multilayer circuit board 80 shares many of the same features of the multilayer circuit board 30 described above with reference to FIGS. 2a and 2b. Thus, those features will retain the same reference designators in FIG. 5.

The multilayer circuit board 80 differs from the multilayer circuit board 30 in the removal of the bypass capacitor 48. Also, the multilayer circuit board 80 replaces the split power/ground layer 38 with a three additional layers which form a buried bypass capacitor. That is, a ground plane layer 84, a power plane layer 82, and a dielectric layer 86 are added to the multilayer circuit board 80 such that a buried bypass capacitor is formed in the multilayer circuit board 80. To insure good capacitive characteristics, the dielectric layer 86 is preferably formed of a high Dk capacitive dielectric such as, for example, 3M C-Ply™.

The cavity 32 is formed in the multilayer circuit board 80 extending through the top layer 34 and the at least one dielectric layer 46 so as to expose at least a portion of the power plane layer 82. The cavity 32 is sized so as to allow an extended gull wing lead 50 from the electronic integrated circuit 36 to be directly electrically connected to the power plane layer 82 such that no power plane vias or ground plane vias are required. Also, no bypass capacitors are needed, thereby eliminating the need to solder same. Thus, the electronic integrated circuit 36 is provided an exceptionally filtered power source.

At this point it should be noted that cavities can be formed in both sides of a multilayer circuit board (e.g., in a double-sided multilayer circuit board) with no detrimental effects to the structure of the double-sided multilayer circuit board. That is, as long as one or more layers are still present between an upper cavity and a lower cavity, there should be no detrimental effects to the structure of the double-sided multilayer circuit board. In fact, regardless of whether there is an opposing cavity formed in the double-sided multilayer circuit board, there should be no detrimental effects to the structure of the double-sided multilayer circuit board. However, even if structural integrity is a concern, most, if not all, circuit boards in use today use board edge stiffeners to provide additional structural support and prevent against warpage.

It should also be noted that a cavity formed in a circuit board in accordance with the present invention as described above has many different forms and functions. For example, a cavity may be precisely sized to coincide with the outer dimensions of an electronic component to be mounted therein so as to assist in precisely mounting the electronic component in the cavity. Alternatively, a cavity may be sized somewhat larger than the size of an electronic component to be mounted therein so as to allow ambient air to assist in cooling the electronic component. Alternatively still, a cavity may be formed as a channel through which air may be forced to assist in cooling an electronic component mounted therein.

It should further be noted that the above-described cavities and/or channels can be formed using several different types of fabrication methods. For example, photolithographic or plasma-based etching can be used to form cavities and/or channels in a resin or epoxy-based multilayer circuit board in accordance with the present invention. Alternatively, if a multilayer circuit board is glass reinforced (and thereby not easily etchable by conventional etching techniques), precision milling by laser ablation using a $CO_2$ laser, or other milling techniques or non-conventional etching techniques, can be used to form cavities and/or channels in a multilayer circuit board in accordance with the present invention. Alternatively still, the dielectric layers and/or the electrically conductive layers may be prefabricated such that the cavities/channels are formed upon assembly of the dielectric layers and the electrically conductive layers into the multilayer circuit board in accordance with the present invention.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for eliminating electrically conductive vias in a multilayer circuit board, the multilayer circuit board having a top layer and a buried layer separated by at least one dielectric layer, the buried layer including an electrically conductive power plane portion and an electrically conductive ground plane portion, the method comprising the step of:

forming a cavity in the multilayer circuit board extending through the top layer and the at least one dielectric layer so as to expose at least a portion of the power plane portion and the ground plane portion of the buried layer within the cavity, wherein the cavity is sized to accommodate an electronic component therein such that the electronic component makes electrical contact with the exposed portion of the power plane portion and the ground plane portion of the buried layer, thereby eliminating the need for electrically conductive vias electrically connected to the power plane portion and the ground plane portion of the buried layer.

2. The method as defined in claim 1, wherein the step of forming a cavity comprises the step of:

etching the cavity in the multilayer circuit board.

3. The method as defined in claim 2, wherein the step of etching the cavity includes photolithographically etching the cavity in the multilayer circuit board.

4. The method as defined in claim 2, wherein the step of etching the cavity includes plasma etching the cavity in the multilayer circuit board.

5. The method as defined in claim 1, wherein the step of forming a cavity comprises the step of:
milling the cavity in the multilayer circuit board.

6. The method as defined in claim 5, wherein the step of milling the cavity includes laser ablating the cavity in the multilayer circuit board.

7. The method as defined in claim 1, wherein the step of forming a cavity comprises the step of:
prefabricating at least one of the top layer and the at least one dielectric layer such that the cavity is formed upon assembly of the top layer and the at least one dielectric layer in the multilayer circuit board.

8. The method as defined in claim 1, wherein the electronic component is a first electronic component, wherein a second electronic component is mounted on the top layer, further comprising the step of:
extending at least one electrically conductive lead of the second electronic component into the cavity for electrical connection with the power plane portion or the ground plane portion of the buried layer.

9. The method as defined in claim 8, wherein the cavity is a first cavity, wherein the at least one dielectric layer is at least one first dielectric layer, wherein an additional layer is disposed above and separated from the top layer by at least one second dielectric layer, further comprising the step of:
forming a second cavity in the multilayer circuit board extending through the additional layer and the at least one second dielectric layer so as to expose at least a portion of the top layer, wherein the second cavity is sized to accommodate the second electronic component therein.

10. The method as defined in claim 9, further comprising the step of:
disposing an electrically conductive shield on the additional layer over the second cavity for shielding electromagnetic interference to and from the first and second electronic components.

11. A method for eliminating electrically conductive vias in a multilayer circuit board, the multilayer circuit board having a top layer and a buried layer separated by at least one dielectric layer, the buried layer including an electrically conductive power/ground plane portion, the method comprising:
forming a cavity in the multilayer circuit board extending through the top layer and the at least one dielectric layer so as to expose at least a portion of the power/ground plane portion of the buried layer within the cavity, wherein the cavity is sized to accommodate an electronic component therein such that the electronic component makes electrical contact with the exposed portion of the power/ground plane portion of the buried layer, thereby eliminating the need for electrically conductive vias electrically connected to the power/ground plane portion of the buried layer.

12. A method for eliminating electrically conductive vias in a multilayer circuit board, the multilayer circuit board having a top layer separated from a group of adjacent buried layers by at least one first dielectric layer, the group of buried layers including an electrically conductive power plane layer, an electrically conductive ground plane layer, and at least one second dielectric layer separating the power plane layer from the ground plane layer so as to form a buried bypass capacitor within the multilayer circuit board, the top layer supporting an electronic component thereon, the method comprising the step of:
forming a cavity in the multilayer circuit board extending through the top layer and the at least one first dielectric layer so as to expose at least a portion of the power plane layer within the cavity, wherein the cavity is sized to accommodate at least one extended electrically conductive lead of the electronic component for electrical connection with the power plane layer, thereby eliminating the need for electrically conductive vias electrically connected to the power plane layer.

* * * * *